United States Patent
Grünwald et al.

(10) Patent No.: US 6,488,384 B2
(45) Date of Patent: *Dec. 3, 2002

(54) METHOD FOR THE COATING OF SUBSTRATES MADE OF PLASTIC

(75) Inventors: Heinrich Grünwald, Niddatal (DE); Thomas Schulte, Niederlangen (DE); Klaus Nauenburg, Hanau (DE); Wilfried Dicken, Wächtersbach (DE)

(73) Assignee: Leybold Systems GmbH, Hanau (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/470,503

(22) Filed: Dec. 22, 1999

(65) Prior Publication Data

US 2002/0097512 A1 Jul. 25, 2002

(30) Foreign Application Priority Data

Dec. 23, 1998 (DE) .......................... 198 59 695

(51) Int. Cl.⁷ ............................ G02B 5/08; G02B 7/182
(52) U.S. Cl. ....................... 359/883; 427/488; 427/489; 427/491
(58) Field of Search ................. 359/883, 884; 427/491, 488, 489

(56) References Cited

U.S. PATENT DOCUMENTS

| | | | |
|---|---|---|---|
| 3,677,792 A | | 7/1972 | Best et al. |
| 3,914,472 A | | 10/1975 | Nakanishi et al. |
| 4,963,012 A | * | 10/1990 | Tracy ........................... 359/883 |
| 5,294,464 A | * | 3/1994 | Geisler ......................... 427/489 |
| 5,378,284 A | * | 1/1995 | Geisler ................ 118/723 MR |
| 5,583,704 A | * | 12/1996 | Fujii ........................... 359/884 |
| 6,146,002 A | * | 11/2000 | Danapilis ..................... 359/884 |
| 6,169,127 B1 | * | 1/2001 | Lohmann ..................... 523/106 |

FOREIGN PATENT DOCUMENTS

| | | |
|---|---|---|
| DE | 2912943 | 10/1979 |
| DE | 2931309 | 2/1980 |
| DE | 2847620 | 5/1980 |
| DE | 3016560 | 8/1981 |
| DE | 3537424 | 4/1987 |
| DE | 3726372 | 3/1988 |
| DE | 4010663 | 10/1991 |
| DE | 4039352 | 6/1992 |
| DE | 4122555 | 1/1993 |
| DE | 4425626 | 1/1996 |
| DE | 19520843 | 12/1996 |
| DE | 19636970 | 3/1998 |

* cited by examiner

Primary Examiner—Cassandra Spyrou
Assistant Examiner—Leo Boutsikaris
(74) Attorney, Agent, or Firm—Smith, Gambrell & Russell, LLP

(57) ABSTRACT

In a method for the coating of substrates made of plastic, with a light-reflecting layer, preferably an aluminum layer, and another layer placed between the substrate and the light-reflecting layer, the additional layer, which has a high barrier effect to substances which migrate or evolve gases from the plastic, is a highly crosslinked hydrocarbon layer, a silicon dioxide, silicon nitride, or silicon oxynitride layer, with a thickness of at least 15 nm, wherein the carbon content of the barrier layer is <15%.

21 Claims, No Drawings

METHOD FOR THE COATING OF SUBSTRATES MADE OF PLASTIC

INTRODUCTION AND BACKGROUND

The present invention concerns a method for the coating of substrates made of plastic with a light-reflecting layer, preferably an aluminum layer and with another layer placed between the substrate and the light-reflecting layer.

The reflecting capacity of reflectors, which are produced on plastic substrates by applying thin metal layers in a vacuum, is frequently affected unsatisfactorily by production and usage conditions. This can have various origins, which frequently are to be found in the characteristics of the surface of the plastic:

On the one hand, the roughness of the plastic surface can be too high. The light is diffusely scattered by this, partially at the expense of the desired reflection. This effect can be reinforced even more unfavorably by the method for the application of the metal layer. Thus, it is known that in the thermal vaporization of metal layers, particle layers are formed, as a rule, whose particle size, and thus roughness, increases with the thickness of the layer. For this reason, there is an optimal layer thickness for the reflecting capacity of metal layers that are applied by vaporization; this thickness ensures a coating which is still sufficient (optically dense) with a minimum particle size. This effect manifests itself, in a particularly undesirable manner, on molded articles. Often very different layer thicknesses are found on them, so that on certain surfaces, a sufficiently thick, and therefore optically dense, and thus completely reflecting layer has not yet been formed. In comparison on other layers, the reflecting capacity is diminished by a particle size which has progressed to an excessively large magnitude. This effect is particularly reinforced with an oblique incidence of the vapor particles on the surface e coated, since protruding peaks are preferably coated and areas of the surface which lie behind them are blocked, and therefore a greatly diminished layer growth takes place there. This problem can be reduced, but not solved, by moving, such as, the molded articles during vapor deposition.

On the other hand, the reflecting capacity of the metal layer depends on its purity. The more the layer is contaminated, for example, by oxide fractions, the more its reflecting capacity declines. In this respect, aluminum layers, which are by far most frequently used in technology, are particularly sensitive, since aluminum vapor is especially reactive. This is particularly troublesome because the contaminated aluminum layers also manifest themselves by a more or less pronounced yellow or brown shade. The important thing therefore is to keep reactive foreign gases away from the metal vapor to the greatest extent possible during the vacuum coating. One common measure for this is to maintain the surfaces as clean as possible in a vacuum. However, this is not sufficient if gases or vapors exit from the plastic material during the coating. These are particularly disadvantageous because they appear precisely at the point where the metal layer is being formed so that with a particularly high probability, they contribute to the contamination of the layer. The problem appears, above all, with plastics which have a strong gas evolution, such as polyamide or BMC (bulk molded compound), and particularly if the plastic was not prelacquered before the vacuum coating.

Finally, an optically satisfactory metal layer can clearly lose reflecting capacity in the course of use, in particular, at elevated temperatures, as may occur in a headlight, if substances from the plastic material migrate and spread in the form of vapors in the headlight. The vapors can condense on colder surfaces of the headlight in the form of a dull, unattractive coating. These coating have a particularly disturbing effect on the reflector, a contemplated border region, and the transparent headlight lens or covering pane. In these cases, the optical appearance of the headlight and frequently also the light efficiency is disturbed in a sensitive manner. This phenomenon is very disturbing, particularly with plastics which have a strong evolution of gas, such as B.C. materials.

To increase the reflecting capacity, therefore, headlight reflectors are frequently provided with a lacquer layer prior to the metal coating. This lacquer layer is supposed to compensate for the roughness of the surface and in the case of plastic parts, suppress the migration and desorption of substances from the plastic material during the metal coating and later operations.

Thus, DE 37 31 686 proposes the application of a polymer layer, with the aid of a plasma, on a previously applied lacquer layer, so as to improve the adhesion, the corrosion resistance, and the reflecting capacity of the subsequently produced metal layer.

A method is also known, in accordance with EP 0 136 450, for the production of a mirror layer, in particular, for headlight reflectors, wherein a layer of aluminum is sputtered on a preferably thermally curable lacquer layer, in particular, synthetic resin-powder layer foundation, in an evacuatable recipient. The sputtering of the aluminum layer takes place after an evacuation to pressures of $8 \times 10^{-3}$ Pa to $3 \times 10^{-2}$ Pa with inert gas sputter pressures between $6 \times 10^{-2}$ Pa and 1 Pa with coating rates of ca. 5 nm/sec, using a magnetron, preferably a planar magnetron.

It is therefore an object of the present invention to improve the process for forming reflecting surfaces on plastic substrates.

SUMMARY OF THE INVENTION

The above and other objects of the present invention can be achieved by applying an intermediate layer with as high as possible a barrier effect toward substances which can migrate and evolve gases from plastic material, onto unlacquered plastics, as reflector or border blanks, before the metal coating by means of a vacuum method, preferably a plasma-aided coating method. Among these substances, that can migrate and evolve gases from plastic material is water. As a rule, however, organic substances, such as the residues of unreacted monomers, for example, acrylonitrile from ABS, or styrene (from B.C.), may also emerge, depending on the plastic material.

Highly crosslinked hydrocarbon layers, silicon dioxide-, silicon nitride-, or silicon oxynitride layers are suitable as the intermediate layer according to the invention. For the barrier effect of the latter layers, it is essential that the carbon content not be selected too high if the layers (as preferred) are produced using silicon-organic compounds. The carbon content should be <15%, preferably <8%. It became evident that such barrier layers not only clearly reduce the migration of turbidity-causing substances from the plastic during the use of the headlight, but rather also enhance the reflecting capacity of the metal layers, in particular, the aluminum layers, produced therefrom. In this respect, the application of the intermediate layer in a large layer thickness, so as to compensate for the roughness of the plastic surface, is, surprisingly, not required. A thickness of 15 nm can be sufficient for an intermediate layer, depending on the plastic material, produced with plasma-CVD or remote plasma-CVD methods.

For layers produced according to this method, a thickness of 30 nm to 60 nm has proved to be particularly good.

DETAILED DESCRIPTION OF INVENTION

The present invention will now be described in further detail.

One variant of the method of the invention resides in another production method of the layer, namely, condensing a radically polymerizable monomer on the plastic parts, under a vacuum, from the gas phase, and subsequently thoroughly polymerizing with the aid of a plasma. This method step (plasma-induced polymerization) includes of the following steps:

First, the part to be coated is tempered to room temperature or preferably a temperature below that and then it is immediately introduced into a vacuum chamber with heated walls. The vacuum chamber is thereupon typically evacuated to 1 Pa. Then, a short plasma pretreatment follows, according to the state of the art, most advantageously, with the goal of increasing the surface energy of the plastic part. To this end, for example, a noble gas, oxygen, nitrogen, air, or another oxygen- or nitrogen-containing gas or gas mixture is allowed m and a plasma is ignited with an equilibrium pressure of preferably 10 Pa to 100 Pa. One has to take care here that the part to be coated is not inadmissibly heated by the plasma treatment.

Subsequently, at least one vaporous monomer is let into the vacuum chamber. This condenses, preferably on the coldest surfaces; that is, on the surface of the part to be coated. With a sufficient level of surface energy of the part to be coated, a closed, smooth monomer film is produced on the surface, which is subsequently polymerized to a solid, dense layer with a thickness of a few nm to $\mu$m by the effect of plasma produced in the immediate vicinity. The advantage of this embodiment of the invention is that the intermediate layer, which is liquid at first, under the condition that its surface energy is lower than that of the plastic surface underneath, forms a smooth surface which compensates for any roughness of the plastic surface.

Regardless of the embodiment according to which the intermediate layer, in accordance with the invention, is formed, it is preferred that the subsequently applied metal layer be applied by means of cathode sputtering. It has become evident that in this case, the light efficiency of headlights is particularly high. This can be attributed to, among other things, the fact that the surface of the metal layers produced by means of cathode sputtering is smoother than the common ones at present and, on the other hand, to the fact that three-dimensional parts can be coated more uniformly by sputtering. This results in it being possible to maintain the layer thickness optimal for the reflecting capacity over the surface to be coated.

For the protection of the metal layer from corrosion (for example, aluminum) and also for protection from damage due to wiping, a protective layer is applied to the metal layer immediately after its production, in accordance with the state of the art. In this respect, a siloxane, such as hexamethyldisiloxane, is produced from the gas phase on the part to be coated, with the aid of a plasma.

For the further suppression of the formation of a condensed product, if necessary, a cover layer with a surface energy of >48 mN/m, preferably >62 mN/m, can be finally applied by means of plasma-CVD or remote plasma-CVD. The result of this is that, for example, with the longer operation of a headlight, produced in accordance with the invention, exiting vapors do not form optically disturbing drops, but rather a closed film, which is not noticeable optically, upon condensation on colder surfaces of the reflector or a border.

The method in accordance with the invention for the production of reflecting coatings on plastic parts is preferably used in a vacuum unit with a lock and several vacuum chambers, separated from one another, in which the plastic parts are coated, one after the other, with the various layers, according to the methods described above, wherein at least one of these vacuum chambers is equipped with a sputtering device and at least one other with a vacuum chamber, with a device for performance of plasma-CVD, remote plasma-CVD, or plasma-induced polymerization. Such units are well know in the art.

After passing the lock, the parts are pretreated in a first chamber with a short, noncoating plasma and subsequently, provided with the intermediate layer. In the following chamber, a reflecting metal layer (for example, of aluminum) is subsequently applied. In the next vacuum chamber, the protective layer and if necessary, immediately following this, the cover layer are applied. Then, the coated parts are conveyed to the atmosphere via a lock.

The reflecting capacity of reflecting layers on plastic parts is improved and the usage time of the coated parts is substantially increased by the aforementioned features. Moreover, it is possible to provide even problematic plastic parts, which have stronger gas evolution and/or a rougher surface, with a reflecting layer, without a prior lacquering; the plastic parts then meet high quality requirements (for example, for motor vehicle front headlights or fog lamps).

The savings in the lacquering finally leads to a massive savings in costs.

The invention permits the most varied embodiment possibilities; one of these is described in more detail below.

EXAMPLE

Reflector parts made of B.C. are affixed on transport frames, are transferred into a unit shown in DE 196 24 609 which is relied on and incorporated herein by reference. In the first vacuum chamber, which is equipped with an electrode for the supply of a high frequency (HF) of 13.56 MHz, an intermediate layer is deposited whose thickness on the plastic part varies between 30 nm and 50 nm, and which is produced with the following parameter conditions:

Monomer inflow rate: 70 cm$^3$/min hexamethyldisiloxane 700 cm$^3$/min oxygen 2200 W high-frequency power Pressure during the coating time: 1 Pa Coating time: 45 s Subsequently, an aluminum layer, with a thickness of ca. 50 nm and the following coating parameters, is sputtered on, in the next vacuum chamber, which is equipped with two sputter cathodes:

60 kW DC per cathode

Argon pressure during the sputtering: 0.5 Pa

Sputter time: 8 s

Then, in the third vacuum chamber, a protective layer with a thickness of 20 nm to 30 nm and the following parameter adjustment is applied. This third chamber is equipped with an HF electrode, in a manner analogous to the first chamber:

Monomer inflow rate: 80 cm$^3$/min hexamethyldisiloxane

1600 W high-frequency power

Pressure during the coating time: 0.5 Pa

Coating time: 20 s

Finally, a cover layer with a surface energy of at least 56 mN/m is applied in the same vacuum chamber:

Monomer inflow rate: 100 cm$^3$/min ethanol

2400 W high-frequency power

Pressure during the coating time: 1 Pa

Coating time: 20 s

We claim:

1. A method for coating a substrate made of plastic to form a reflector comprising:

depositing a highly crosslinked hydrocarbon layer, a silicon dioxide layer, a silicon nitride layer, or a silicon oxynitride layer onto said substrate to form an intermediate layer; and applying a light reflecting layer onto said intermediate layer;

wherein the silicon dioxide layer, the silicon nitride layer, or the silicon oxynitride layer has a carbon content;

wherein said carbon content is less than 15 percent.

2. The method according to claim 1, wherein said light-reflecting layer comprises aluminum.

3. The method according to claim 1, wherein the intermediate layer is 30 nm to 60 nm.

4. A method for coating a substrate made of plastic to form a reflector comprising:

condensing a radically polymerizable monomer from a gas phase onto the substrate under a vacuum and subsequently thoroughly polymerizing said monomer by means of a plasma.

5. The method according to claim 4 further comprising introducing the plasma into a process chamber with heated walls and, under a partial pressure, exposing the substrate to a vaporous monomer and after condensation of the monomer on the substrate to a plasma.

6. A method for creating a barrier coating on a substrate made of plastic which plastic has not been otherwise treated, and which substrate is to be subsequently coated with a light-reflecting layer, comprising:

depositing on said substrate a highly crosslinked hydrocarbon containing layer, with a thickness of at least 15 nm at a pressure of 10 Pa to 100 Pa.

7. The method according to claim 6 further comprising condensing a radically polymerizable monomer from a gas phase onto the substrate under a vacuum and subsequently thoroughly polymerizing said monomer by means of a plasma for which purpose the substrate, at room temperature or below, is introduced into a process chamber with heated walls and is exposed to a vaporous monomer under a partial pressure and after condensation of the monomer on the substrate is exposed to a plasma.

8. The method according to claim 6, wherein the light reflecting layer is applied onto the intermediate layer by means of cathode sputtering.

9. A method for creating a barrier coating on a substrate made of plastic which plastic has not been otherwise treated, and which substrate is to be subsequently coated with a light reflecting layer, comprising:

depositing on said substrate carbon containing silicon dioxide, carbon containing silicon nitride, or carbon containing silicon oxynitride, with a thickness of at least 15 nm at a pressure of 10 Pa to 100 Pa;

wherein the carbon containing silicon dioxide, carbon containing silicon nitride, or carbon containing silicon oxynitride contain less than 15% carbon.

10. A reflector part made by the process according to claim 1.

11. A headlight made by the process according to claim 1.

12. A taillight made by the process according to claim 1.

13. A headlight or taillight for a vehicle comprising:

a substrate made of plastic;

a light-reflecting layer;

a barrier layer in between the light reflecting layer and the substrate;

wherein said barrier layer comprises a highly crosslinked hydrocarbon layer, a silicon dioxide layer, a silicon nitride layer, or a silicon oxynitride layer;

wherein the silicon dioxide layer, the silicon nitride layer, or the silicon oxynitride layer has a carbon content;

said carbon content is less than 15%.

14. The method according to claim 1, further comprising the following step:

applying a protective layer having a thickness of 20 to 30 nm onto the light-reflecting. layer.

15. The method according to claim 14, further comprising the following step:

applying a cover layer having a surface energy greater than 48 mN/m onto said protective layer.

16. A method for coating a plastic part comprising the following steps:

tempering the plastic part to room temperature or below;

introducing the plastic part into a vacuum chamber with heated walls;

evacuating the vacuum chamber;

pretreating the plastic part to increase its surface energy;

releasing at least one vaporous monomer into the vacuum chamber;

condensing the vaporous monomer to form a smooth film on the plastic part; and polymerizing the smooth film.

17. The method according to claim 16, further comprising the following step:

applying a metal layer onto the smooth film to form a reflector.

18. The method according to claim 17, further comprising the following step:

applying a protective layer to the metal layer.

19. The method according to claim 18, further comprising the following step:

applying a cover layer to the protective layer.

20. The method according to claim 16, wherein the smooth film comprises a silicon dioxide layer, a silicon nitride layer, a silicon oxynitride layer, or a highly cross-linked hydrocarbon;

and wherein the silicon dioxide layer, the silicon nitride layer, or the silicon oxynitride layer have a carbon content that is less than 15%.

21. A method for coating a plastic substrate to form a reflector comprising:

depositing a highly crosslinked hydrocarbon layer, a carbon containing silicon dioxide layer, a carbon containing silicon nitride layer, or a carbon containing silicon oxynitride layer onto said substrate to form an intermediate layer; and applying a light reflecting layer onto said intermediate layer;

wherein said intermediate layer contains up to 8% carbon.

* * * * *